(12) United States Patent
Cheng et al.

(10) Patent No.: US 10,770,567 B2
(45) Date of Patent: Sep. 8, 2020

(54) EMBEDDED ENDPOINT FIN REVEAL

(71) Applicant: International Business Machines Corporation, Armonk, NY (US)

(72) Inventors: Kangguo Cheng, Schenectady, NY (US); Peng Xu, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 4 days.

(21) Appl. No.: 15/784,672

(22) Filed: Oct. 16, 2017

(65) Prior Publication Data

US 2018/0076301 A1     Mar. 15, 2018

Related U.S. Application Data

(63) Continuation of application No. 15/261,055, filed on Sep. 9, 2016, now Pat. No. 9,923,083.

(51) Int. Cl.

| | |
|---|---|
| *H01L 29/66* | (2006.01) |
| *H01L 21/3105* | (2006.01) |
| *H01L 21/311* | (2006.01) |
| *H01L 21/3065* | (2006.01) |
| *H01L 21/308* | (2006.01) |

(52) U.S. Cl.
CPC .. *H01L 29/66795* (2013.01); *H01L 21/31053* (2013.01); *H01L 21/31116* (2013.01); *H01L 21/31144* (2013.01); *H01L 21/3065* (2013.01); *H01L 21/3081* (2013.01)

(58) Field of Classification Search
CPC ......... H01L 29/66795; H01L 21/31116; H01L 21/31053; H01L 21/31144; H01L 21/3081; H01L 21/3065

USPC .......................................................... 257/401
See application file for complete search history.

(56) References Cited

U.S. PATENT DOCUMENTS

| | | | |
|---|---|---|---|
| 5,766,497 | A | 6/1998 | Mitwalsky et al. |
| 5,843,363 | A | 12/1998 | Mitwalsky et al. |
| 5,994,229 | A | 11/1999 | Chen et al. |
| 7,011,762 | B1 | 3/2006 | Lyons et al. |
| 8,426,315 | B2 | 4/2013 | Tochishita et al. |
| 8,980,715 | B2 | 3/2015 | Grill et al. |
| 8,980,758 | B1 | 3/2015 | Ling et al. |
| 8,981,466 | B2 | 3/2015 | Grill et al. |
| 9,209,095 | B2 | 12/2015 | Chang et al. |
| 9,287,135 | B1 | 3/2016 | Doris et al. |
| 9,431,395 | B2 * | 8/2016 | Costrini ............. H01L 27/0886 |
| 2002/0197807 | A1 | 12/2002 | Jagannathan et al. |
| 2005/0020003 | A1 | 1/2005 | Johansson et al. |
| 2007/0072430 | A1 | 3/2007 | Tochishita et al. |

(Continued)

FOREIGN PATENT DOCUMENTS

KR     1020050083051 A     8/2005

OTHER PUBLICATIONS

English translation for Korean Application No. KR1020050083051A.
List of IBM Patents or Patent Applications Treated as Related.

*Primary Examiner* — Bo Fan
(74) *Attorney, Agent, or Firm* — Vazken Alexanian; Ryan, Mason & Lewis, LLP (57) ABSTRACT

A semiconductor structure is provided. The semiconductor structure includes a plurality of fins formed from a substrate, at least one liner segment formed along a portion of the substrate, a first dielectric layer formed on the substrate and bounded by the liner segment, and a second dielectric layer formed within an interior of the liner segment.

20 Claims, 5 Drawing Sheets

(56) References Cited

U.S. PATENT DOCUMENTS

| | | |
|---|---|---|
| 2007/0082446 A1 | 4/2007 | Olligs et al. |
| 2007/0105295 A1 | 5/2007 | Kim |
| 2007/0134854 A1 | 6/2007 | Zhang et al. |
| 2008/0048215 A1 | 2/2008 | Davies |
| 2012/0100680 A1 | 4/2012 | Chuang |
| 2014/0256153 A1 | 9/2014 | Grill et al. |
| 2015/0060937 A1 | 3/2015 | Hikasa |
| 2015/0076609 A1 | 3/2015 | Xie et al. |
| 2016/0043223 A1 | 2/2016 | Xie et al. |
| 2016/0163826 A1* | 6/2016 | Cheng .............. H01L 29/66636 257/401 |
| 2016/0218104 A1* | 7/2016 | Wen .................... H01L 21/845 |

\* cited by examiner

EMBEDDED ENDPOINT FIN REVEAL

BACKGROUND

Semiconductor structures or devices may be embodied as field-effect transistors (FETs), such as metal-oxide-semiconductor FETs (MOSFETs). A FinFET is a nonplanar MOSFET that may be built on a silicon substrate, such as a silicon-on-insulator (SOI) substrate. FinFETs may provide advantages over planar MOSFETS. For example, FinFETs utilize vertical fins that allow for larger areal densities, thereby increasing the number of structures that may be built on an integrated circuit, or chip. Accordingly, FinFETs provide improved areal density over planar MOSFETs.

SUMMARY

Illustrative embodiments of the invention provide techniques for fabricating FET structures, such as, e.g., FinFET structures. While illustrative embodiments are well-suited to improve operations of FinFET structures, alternative embodiments may be implemented with other types of semiconductor structures.

For example, in one illustrative embodiment, a semiconductor structure comprises a plurality of fins formed from a substrate. The structure also comprises at least one liner segment formed along a portion of the substrate. Further, the structure comprises a first dielectric layer formed on the substrate and bounded by the liner segment, and a second dielectric layer formed within an interior of the liner segment.

In another illustrative embodiment, an integrated circuit comprises a plurality of fins formed from a substrate. The integrated circuit also comprises at least one liner segment formed along a portion of the substrate. Further, the integrated circuit comprises a first dielectric layer formed on the substrate and bounded by the liner segment, and a second dielectric layer formed within an interior of the liner segment.

These and other exemplary embodiments of the invention will be described in or become apparent from the following detailed description of exemplary embodiments, which is to be read in connection with the accompanying drawings.

DETAILED DESCRIPTION

In illustrative embodiments, techniques are provided for fabricating semiconductor devices comprised of one or more FinFETs. More particularly, illustrative embodiments provide techniques for fabricating semiconductor devices with uniform fin reveal. As will be explained in illustrative embodiments, such fabrication techniques are advantageous over conventional fabrication techniques.

Furthermore, it is to be understood that embodiments discussed herein are not limited to the particular materials, features, and processing steps shown and described herein. In particular, with respect to fabrication (forming or processing) steps, it is to be emphasized that the descriptions provided herein are not intended to encompass all of the steps that may be used to form a functional integrated circuit device. Rather, certain steps that are commonly used in fabricating such devices are purposefully not described herein for economy of description.

Moreover, the same or similar reference numbers are used throughout the drawings to denote the same or similar features, elements, layers, regions, or structures, and thus, a detailed explanation of the same or similar features, elements, layers, regions, or structures will not be repeated for each of the drawings. It is to be understood that the terms "about," "approximately" or "substantially" as used herein with regard to thicknesses, widths, percentages, ranges, etc., are meant to denote being close or approximate to, but not exactly. For example, the term "about" or "substantially" as used herein implies that a small margin of error is present such as, by way of example only, 1% or less than the stated amount. Also, in the FIGURES, the illustrated scale of one layer, structure, and/or region relative to another layer, structure, and/or region is not necessarily intended to represent actual scale.

Uniform fin reveal is highly desired to minimize device variability. In fabricating a conventional FinFET structure, fin reveal depth may not be easy to control. For example, a dense fin region may have many variations. It would be advantageous to control fin reveal in a dense fin region. In one embodiment, a fin liner may be implemented as an embedded endpoint layer to increase control of the fin reveal in a dense fin region.

Figure 1A:
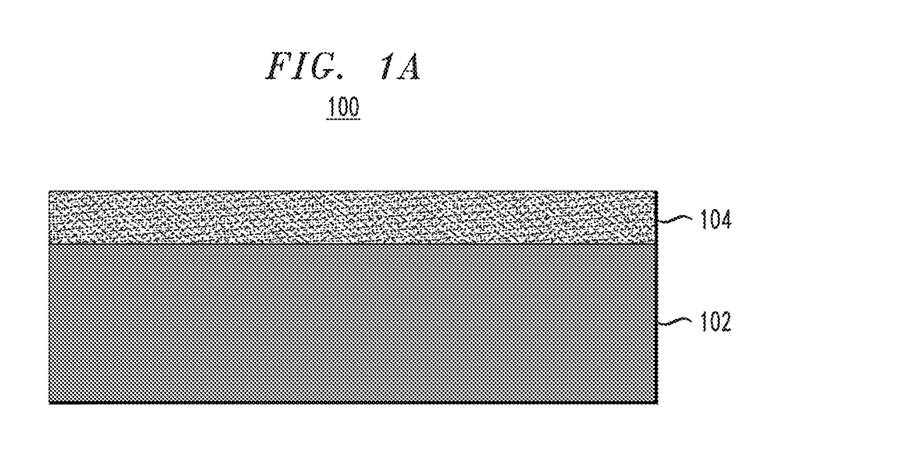
FIG. 1A is a schematic cross-sectional side view of a portion of a semiconductor device at a first-intermediate fabrication stage, according to an embodiment of the invention.

FIGS. 1A-1L illustrate an exemplary process for fabricating a semiconductor structure for increasing control of fin reveal in a dense fin region. FIG. 1A illustrates a semiconductor structure 100 at a first-intermediate fabrication stage. For the purpose of clarity, several fabrication steps leading up to the production of the semiconductor structure 100 as illustrated in FIG. 1A are omitted. In other words, semiconductor structure 100 does not necessarily start out in the form illustrated in FIG. 1A, but may develop into the illustrated structure over one or more well-known processing steps which are not illustrated but are well-known to those of ordinary skill in the art. Also, note that the same reference numeral (100) is used to denote the semiconductor structure through the various intermediate fabrication stages illustrated in FIGS. 1A through 1L. Note also that semiconductor structure 100 can also be considered to be a semiconductor device and/or an integrated circuit, or some part thereof.

Semiconductor structure 100 in FIG. 1A is shown having a substrate 102. In one embodiment, substrate 102 is comprised of silicon. For example, substrate 102 may be a silicon-on-insulator (SOI) substrate. Formed on substrate 102 is layer 104. In one embodiment, layer 104 is formed by depositing a layer of silicon mononitride (SiN).

Figure 1B:
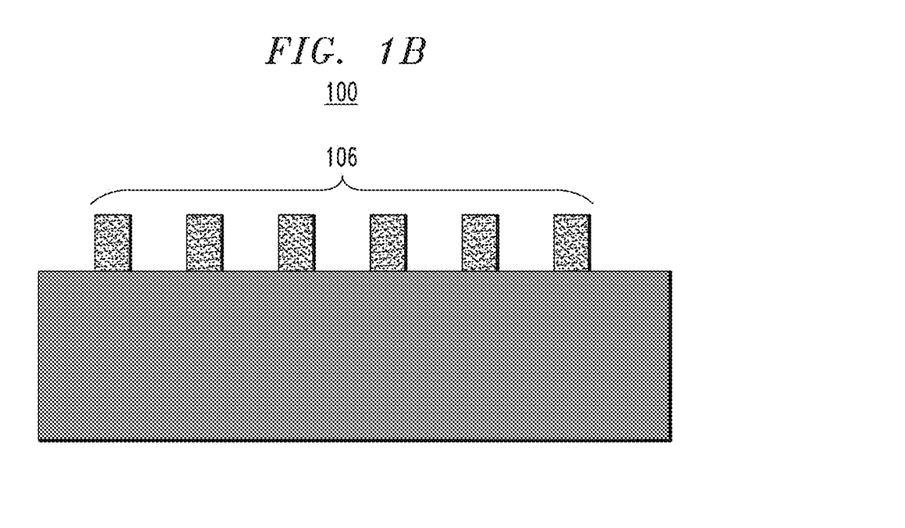
FIG. 1B is a schematic cross-sectional side view of a portion of a semiconductor device at a second-intermediate fabrication stage, according to an embodiment of the invention.

FIG. 1B illustrates semiconductor structure 100 at a second-intermediate fabrication stage. During this stage, a spacer patterning technique is applied to layer 104, forming set of fin hard masks 106. Although six fin hard masks are shown in set of fin hard masks 106, this number should not be considered limiting. In one embodiment, the spacer patterning technique used to form set of fin hard masks 106 is self-aligned double patterning (SADP). The SADP process is known in the art, and a further description of SADP will not be provided herein. In an alternative embodiment, the SADP process may be applied in two iterations, resulting in what is known as self-aligned quadruple patterning (SAQP). It is to be understood that SADP and SAQP are illustrative processes, and it is to be appreciated that any spacer patterning process may be implemented in accordance with the embodiments described herein.

Figure 1C:
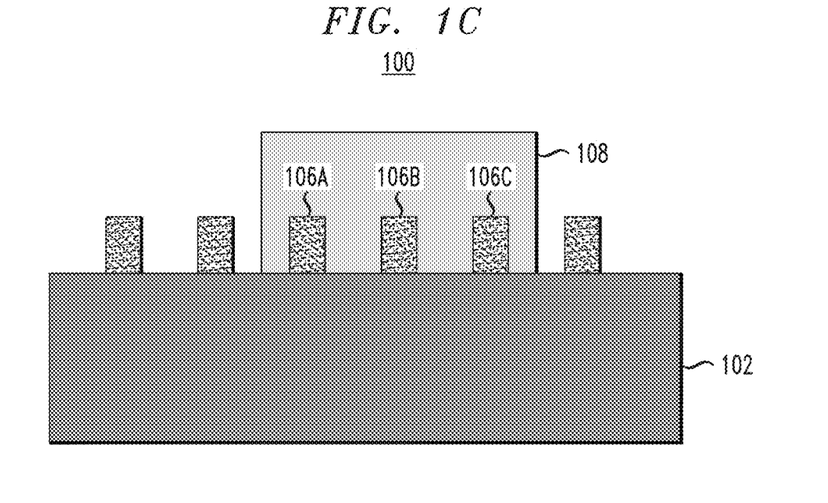
FIG. 1C is a schematic cross-sectional side view of a portion of a semiconductor device at a third-intermediate fabrication stage, according to an embodiment of the invention.

FIG. 1C illustrates semiconductor structure 100 at a third-intermediate fabrication stage. During this stage, cut mask 108 is patterned on substrate 102. Cut mask 108 is formed over at least a portion of the fin hard masks formed in FIG. 1B. As illustratively shown in FIG. 1C, cut mask 108 is formed over three of the six fin hard masks, namely fin hard masks 106A, 106B and 106C. Cut mask 108 is shown filling in the gap between fin hard masks 106A and 106B, and filling in the gap between fin hard masks 106B and 106C. Additionally, cut mask 108 is shown filling a portion of the gap to the left of fin hard mask 106A, and a portion of the gap to the right of fin hard mask 106C. However, the cut mask depicted in FIG. 1C is purely exemplary, and the number of fin hard masks within the set of fin hard masks that cut mask 108 is formed over should not be considered limiting.

Figure 1D:
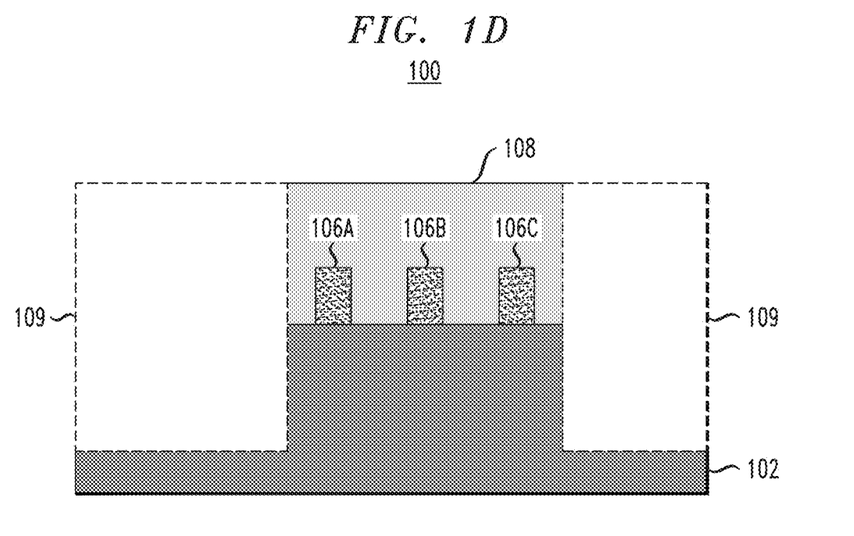
FIG. 1D is a schematic cross-sectional side view of a portion of a semiconductor device at a fourth-intermediate fabrication stage, according to an embodiment of the invention.

FIG. 1D illustrates semiconductor structure 100 at a fourth-intermediate fabrication stage, During this stage, material from semiconductor structure 100 is removed via one or more etching steps. As shown, the material to the left and the right of cut mask 108 is vertically removed until reaching a particular height of substrate 102 to form non-device regions 109. In one embodiment, removing the material from semiconductor structure 100 comprises performing a fin-cut region etch and mask etch back to substrate 102. For example, performing the fin-cut region etch and mask etch back may comprise performing an etching process. In one embodiment, the etching process is an anisotropic etching process (e.g., anisotropic reactive-ion etching ERIE)). However, any type of etching process may be used to perform the fin-cut region etch and mask etch back in accordance with the embodiments described herein.

Figure 1E:
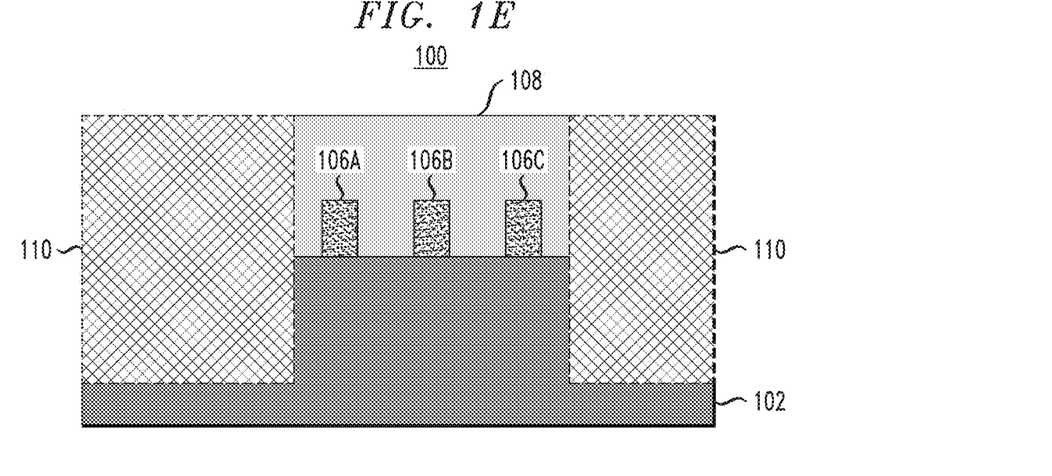
FIG. 1E is a schematic cross-sectional side view of a portion of a semiconductor device at a fifth-intermediate fabrication stage, according to an embodiment of the invention.

FIG. 1E illustrates semiconductor structure 100 at a fifth-intermediate fabrication stage. During this stage, a first shallow trench isolation (STI) layer, $STI_1$ 110, is formed in non-device regions 109 of semiconductor structure 100. As is known in the art, STI is used to prevent electric current leakage between adjacent semiconductor device components. $STI_1$ 110 may be comprised of a dielectric material. In one embodiment, $STI_1$ 110 is comprised of an oxide. For example, $STI_1$ 110 may be comprised of silicon dioxide ($SiO_2$). One or more processes for forming $STI_1$ 110 are known in the art, and a further description of the formation of $STI_1$ 110 will not be provided herein.

Figure 1F:
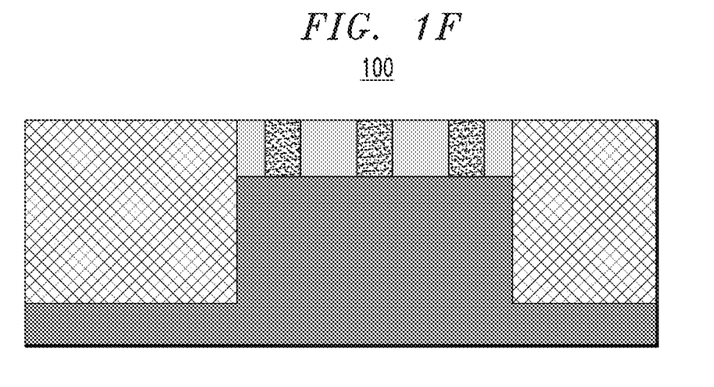
FIG. 1F is a schematic cross-sectional side view of a portion of a semiconductor device at a sixth-intermediate fabrication stage, according to an embodiment of the invention.

FIG. 1F illustrates semiconductor structure 100 at a sixth-intermediate fabrication stage. During this stage, material from semiconductor structure 100 is removed to reach a substantially uniform height within semiconductor structure 100. In one embodiment, the material is removed via a chemical mechanical planarization (CMP) process. However, any type of material removal process may be used to remove the material from semiconductor structure 100 in accordance the embodiments described herein.

Figure 1G:
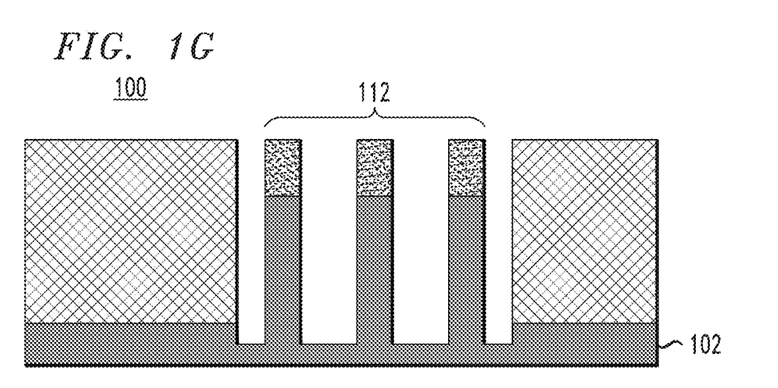
FIG. 1G is a schematic cross-sectional side view of a portion of a semiconductor device at a seventh-intermediate fabrication stage, according to an embodiment of the invention.

FIG. 1G illustrates semiconductor structure 100 at a seventh-intermediate fabrication stage. During this stage, set of fins 112 is formed. As shown, set of fins 112 is formed by etching down through the cut mask, until at least a portion of substrate 102 is removed. In one embodiment, forming set of fins 112 comprises etching down through the cut mask below 70 nm from the top of set of fins 112. The etching may be performed by an anisotropic etching process. In one embodiment, the etching process is anisotropic RIE. However, any type of etching process may be used to form set of fins 112 in accordance the embodiments described herein.

Figure 1H:
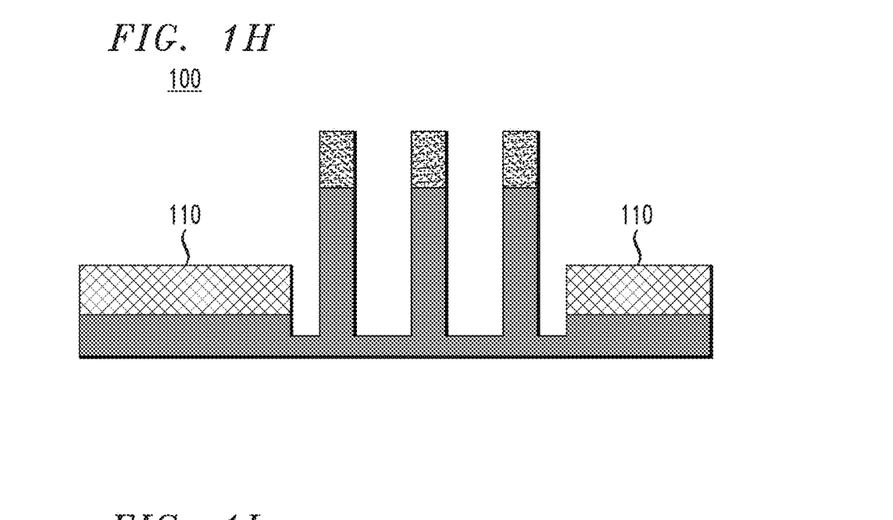
FIG. 1H is a schematic cross-sectional side view of a portion of a semiconductor device at an eight-intermediate fabrication stage, according to an embodiment of the invention.

FIG. 1H illustrates semiconductor structure 100 at an eighth-intermediate fabrication stage. During this stage, $STI_1$ 110 is recessed. As is known in the art, recessing $STI_1$ 110 is a step performed dining the STI process to form the active region and isolation region of semiconductor structure 100. In one embodiment, an anisotropic etching process (e.g., a dry etching process) may be performed to recess $STI_1$ 110. In an alternative embodiment, an isotropic etching process (e.g., a wet etching process) may be used. However, this may cause the structure of semiconductor structure 100 to change. For example, the recessed $STI_1$ 110 may be narrower than the underlying substrate 102.

Figure 1I:
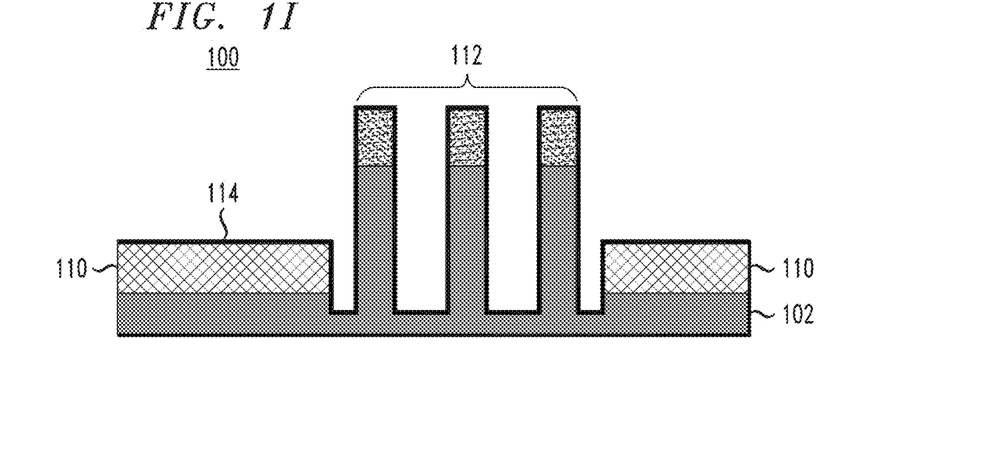
FIG. 1I is a schematic cross-sectional side view of a portion of a semiconductor device at a ninth-intermediate fabrication stage, according to an embodiment of the invention.

FIG. 1I illustrates semiconductor structure 100 at a ninth-intermediate fabrication stage. During this stage, liner 114 is deposited. As shown, liner 114 is deposited along the exposed surfaces of $STI_1$ 110 and set of fins 112. In one embodiment, liner 114 is implemented as an embedded endpoint layer to increase fin reveal control in a dense fin region. Liner 114 may be comprised of SiN. In an alternative embodiment, an (optional) oxide layer (not shown) may be formed between set of fins 112 and liner 114.

Figure 1J:
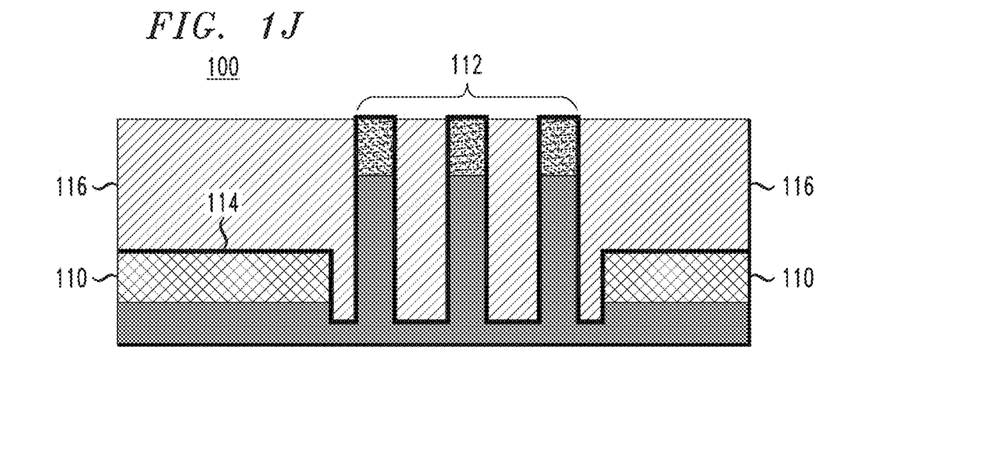
FIG. 1J is a schematic cross-sectional side view of a portion of a semiconductor device at a tenth-intermediate fabrication stage, according to an embodiment of the invention.

FIG. 1J illustrates semiconductor structure 100 at a tenth-intermediate fabrication stage. During this stage, a second STI layer, $STI_2$ 116, is formed. $STI_2$ 116 is formed by filling in the gap region defined by liner 114 and set of fins 112.

Similar to $STI_1$ 110, $STI_2$ 116 may be comprised of a dielectric material. In one embodiment, $STI_2$ 116 is comprised of an oxide. For example, $STI_2$ 116 may be comprised of silicon dioxide ($SiO_2$). $STI_2$ 116 may be comprised of either the same or different material as $STI_1$ 110. One or more processes for forming $STI_1$ 110 are known in the art, and a further description of the formation of $STI_1$ 100 will not be provided herein. A chemical mechanical planarization (CMP) process is then performed to polish the top surface of semiconductor structure 100. Specific details regarding implementation of the CMP process are known in the art, and a further description thereof with not be provided herein.

Figure 1K:
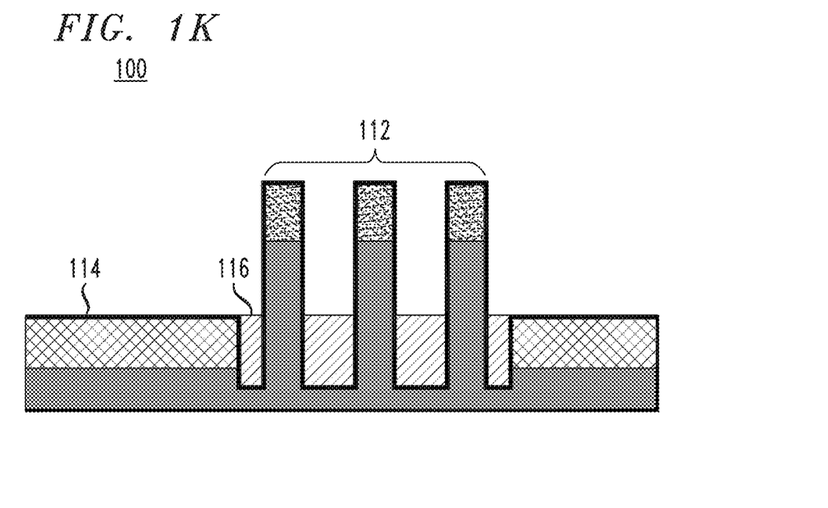
FIG. 1K is a schematic cross-sectional side view of a portion of a semiconductor device at an eleventh-intermediate fabrication stage, according to an embodiment of the invention.

FIG. 1K illustrates semiconductor structure 100 at an eleventh-intermediate fabrication stage. This stage corresponds to a dense fin reveal process. As shown, a portion of $STI_2$ 116 is removed to reveal set of fins 112. In one embodiment, the portion of $STI_2$ 116 is removed via an etching process. For example, an anisotropic etching process may be used to remove the portion of $STI_2$ 116. In one embodiment, the etching process is anisotropic RIE. However, any type of etching process may be used to remove the portion of $STI_2$ 116 in accordance the embodiments described herein.

As referenced previously with respect to FIG. 1I, liner 114 may be implemented as an embedded endpoint layer to increase control of the fin reveal in a dense fin region. That is, liner 114 dictates the endpoint of the process for removing the portion of $STI_2$ 116 during the dense fin reveal. It is important to note how liner 114 enables close control of the etch in relation to each fin of the set of fins 112 in the dense fin reveal process described herein, as compared to conventional dense fin reveal processes.

Figure 1L:
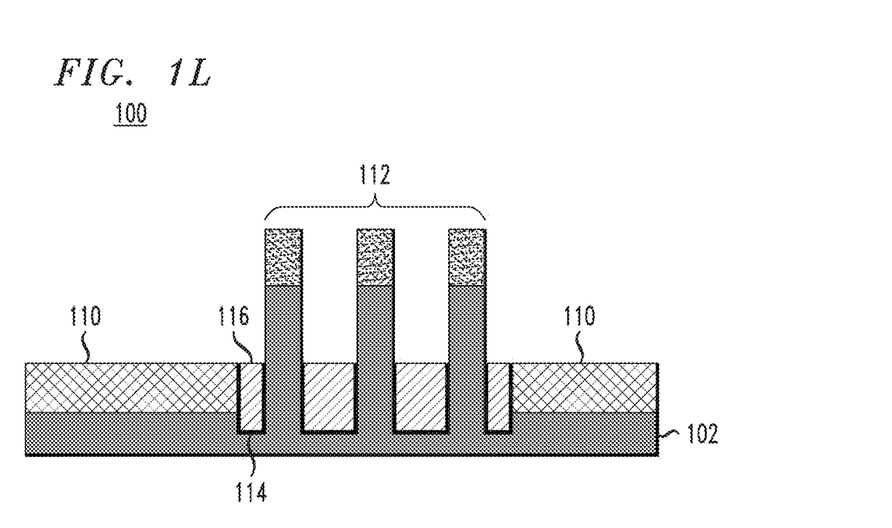
FIG. 1L is a schematic cross-sectional side view of a portion of a semiconductor device at a twelfth-intermediate fabrication stage, according to an embodiment of the invention.

FIG. 1L illustrates semiconductor structure 100 at a twelfth-intermediate fabrication stage. During this stage, processing steps are performed prior to removal of the mask material from semiconductor device 100. As shown, the fin hard mask of each fin of set of fins 112 is removed, such that each fin of set of fins 112 includes substrate 102. Additionally, as shown, the portion of liner 114 formed on the exposed surface of $STI_1$ 110 is removed. Thus, a plurality of liner segments remain, with the interior of each liner segment comprising dielectric material from $STI_2$ 116. Thus, advantageously, the liner 114 serves as an embedded endpoint layer.

After completion of this stage, further conventional fabrication steps may take place to form remaining features of semiconductor structure 100, such as gate formation, etc.

It is to be understood that the methods discussed herein for fabricating semiconductor structures can be incorporated within semiconductor processing flows for fabricating other types of semiconductor devices and integrated circuits with various analog and digital circuitry or mixed-signal circuitry. In particular, integrated circuit dies can be fabricated with various devices such as transistors, diodes, capacitors, inductors, etc. An integrated circuit in accordance with embodiments can be employed in applications, hardware, and/or electronic systems. Suitable hardware and systems for implementing the invention may include, but are not limited to, personal computers, communication networks, electronic commerce systems, portable communications devices (e.g., cell phones), solid-state media storage devices, functional circuitry, etc. Systems and hardware incorporating such integrated circuits are considered part of the embodiments described herein.

Furthermore, various layers, regions, and/or structures described above may be implemented in integrated circuits (chips). The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

Although illustrative embodiments have been described herein with reference to the accompanying drawings, it is to be understood that the invention is not limited to those precise embodiments, and that various other changes and modifications may be made by one skilled in the art without departing from the scope or spirit of the invention.

What is claimed is:

1. A semiconductor structure comprising:
    a plurality of fins formed from a substrate having a top surface, wherein the substrate has recessed portions in the top surface and along a portion of each sidewall of the plurality of fins;
    at least one liner segment disposed on the recessed portions in the top surface of the substrate and along a portion of each sidewall of the plurality of fins;
    a first dielectric layer in contact with a non-recessed portion of the top surface of the substrate and bounded by the liner segment; and
    a second dielectric layer disposed within an interior of the liner segment.

2. The semiconductor structure of claim 1, herein the substrate is comprised of silicon (Si).

3. The semiconductor structure of claim 1, wherein the liner is comprised of silicon mononitride (SiN).

4. The semiconductor structure of claim 1, wherein the first dielectric layer and the second dielectric layer are comprised of a same material.

5. The semiconductor structure of claim 1, wherein the first dielectric layer and the second dielectric layer are comprised of different materials.

6. The semiconductor structure claim 1, wherein the first dielectric layer comprises an oxide.

7. The semiconductor structure of claim 6, wherein the oxide comprises silicon dioxide ($SiO_2$).

8. The semiconductor structure of claim 1, wherein the second dielectric layer comprises an oxide.

9. The semiconductor structure of claim 8, wherein the oxide comprises silicon dioxide ($SiO_2$).

10. The semiconductor structure of claim 1, wherein the semiconductor structure is part of a Fin FET device.

11. An integrated circuit comprising:
    a plurality of fins formed from a substrate having a top surface, wherein the substrate has recessed portions in the top surface and along a portion of each sidewall of the plurality of fins;
    at least one liner segment disposed on the recessed portions in the top surface of the substrate and along a portion of each sidewall of the plurality of fins;
    a first dielectric layer in contact with a non-recessed portion of the top surface of the substrate and bounded by the liner segment; and a second dielectric layer disposed within an interior of the liner segment.

12. The integrated circuit of claim 11, wherein the substrate is comprised of silicon (Si).

13. The integrated circuit of claim 11, wherein the liner is comprised of silicon mononitride (SiN).

14. The integrated circuit of claim 11, wherein the first dielectric layer and the second dielectric layer are comprised of a same material.

15. The integrated circuit of claim 11, wherein the first dielectric layer and the second dielectric layer are comprised of different materials.

16. The integrated circuit claim 11, wherein the first dielectric layer comprises an oxide.

17. The integrated circuit of claim 16, wherein the oxide comprises silicon dioxide ($SiO_2$).

18. The integrated circuit of claim 11, wherein the second dielectric layer comprises an oxide.

19. The integrated circuit of claim 18, wherein the oxide comprises silicon dioxide ($SiO_2$).

20. The integrated circuit of claim 15, wherein the integrated circuit is part of one or more FinFET devices.

* * * * *